United States Patent
Tajalli et al.

(10) Patent No.: US 10,742,451 B2
(45) Date of Patent: Aug. 11, 2020

(54) PASSIVE MULTI-INPUT COMPARATOR FOR ORTHOGONAL CODES ON A MULTI-WIRE BUS

(71) Applicant: Kandou Labs, S.A., Lausanne (CH)

(72) Inventors: Armin Tajalli, Salt Lake City, UT (US); Chen Cao, Lausanne (CH); Kiarash Gharibdoust, Lonay (CH)

(73) Assignee: KANDOU LABS, S.A., Lausanne (CH)

( * ) Notice: Subject to any disclaimer, the term of this patent is extended or adjusted under 35 U.S.C. 154(b) by 0 days.

(21) Appl. No.: 16/435,412

(22) Filed: Jun. 7, 2019

(65) Prior Publication Data

US 2019/0379563 A1    Dec. 12, 2019

Related U.S. Application Data

(60) Provisional application No. 62/684,538, filed on Jun. 13, 2018, provisional application No. 62/683,955, filed on Jun. 12, 2018.

(51) Int. Cl.
*H04L 25/02*    (2006.01)

(52) U.S. Cl.
CPC ...... *H04L 25/0276* (2013.01); *H04L 25/0278* (2013.01)

(58) Field of Classification Search
CPC ............... H04L 25/026; H04L 25/0264; H04L 25/0272; H04L 25/0274; H04L 25/0276; H04L 25/0278; H04L 25/0292
See application file for complete search history.

(56) References Cited

U.S. PATENT DOCUMENTS

| | | | |
|---|---|---|---|
| 3,636,463 | A | 1/1972 | Ongkiehong |
| 3,824,494 | A | 7/1974 | Wilcox |
| 3,939,468 | A | 2/1976 | Mastin |
| 4,276,543 | A | 6/1981 | Miller et al. |

(Continued)

FOREIGN PATENT DOCUMENTS

WO    2018052657 A1    3/2018

OTHER PUBLICATIONS

Anadigm , "Using the Anadigm Multiplier CAM", Design Brief 208, www.anadigm.com, Copyright 2002, 2002, (6 pages).

(Continued)

*Primary Examiner* — Siu M Lee
(74) *Attorney, Agent, or Firm* — Invention Mine LLC

(57) ABSTRACT

Methods and systems are described for receiving a plurality of signals via a plurality of wires of a multi-wire bus, the plurality of signals corresponding to symbols of a codeword of a vector signaling code, generating, using an interconnected resistor network connected to the plurality of wires of the multi-wire bus, a plurality of combinations of the symbols of the codeword of the vector signaling code on a plurality of output nodes, the plurality of output nodes including a plurality of pairs of sub-channel output nodes associated with respective sub-channels of a plurality of sub-channels, and generating a plurality of sub-channel outputs using a plurality of differential transistor pairs, each differential transistor pair of the plurality of differential transistor pairs connected to a respective pair of sub-channel output nodes of the plurality of pairs of sub-channel output nodes.

16 Claims, 11 Drawing Sheets

(56) References Cited

U.S. PATENT DOCUMENTS

| | | | |
|---|---|---|---|
| 4,774,498 A | 9/1988 | Traa | |
| 4,897,657 A | 1/1990 | Brubaker | |
| 5,017,924 A | 5/1991 | Guiberteau et al. | |
| 5,459,465 A | 10/1995 | Kagey | |
| 5,510,736 A | 4/1996 | Van | |
| 5,748,948 A | 5/1998 | Yu et al. | |
| 5,793,254 A | 8/1998 | OConnor | |
| 5,945,935 A | 8/1999 | Kusumoto et al. | |
| 6,226,330 B1 * | 5/2001 | Mansur | H04B 3/00 375/257 |
| 6,232,908 B1 | 5/2001 | Nakaigawa | |
| 6,346,907 B1 | 2/2002 | Dacy et al. | |
| 6,384,758 B1 | 5/2002 | Michalski et al. | |
| 6,396,329 B1 | 5/2002 | Zerbe | |
| 6,400,302 B1 | 6/2002 | Amazeen et al. | |
| 6,462,584 B1 | 10/2002 | Proebsting | |
| 6,563,382 B1 | 5/2003 | Yang | |
| 6,624,699 B2 | 9/2003 | Yin et al. | |
| 6,839,587 B2 | 1/2005 | Yonce | |
| 6,879,816 B2 | 4/2005 | Bult et al. | |
| 6,888,483 B2 | 5/2005 | Mulder | |
| 6,972,701 B2 | 12/2005 | Jansson | |
| 7,075,996 B2 | 7/2006 | Simon et al. | |
| 7,167,523 B2 * | 1/2007 | Mansur | H04B 3/548 327/72 |
| 7,188,199 B2 | 3/2007 | Leung et al. | |
| 7,199,728 B2 | 4/2007 | Dally et al. | |
| 7,269,212 B1 | 9/2007 | Chau et al. | |
| 7,285,977 B2 | 10/2007 | Kim | |
| 7,372,295 B1 | 5/2008 | Wei | |
| 7,372,390 B2 | 5/2008 | Yamada | |
| 7,397,302 B2 | 7/2008 | Bardsley et al. | |
| 7,528,758 B2 | 5/2009 | Ishii | |
| 7,656,321 B2 | 2/2010 | Wang | |
| 7,683,720 B1 | 3/2010 | Yehui et al. | |
| 7,688,102 B2 | 3/2010 | Bae et al. | |
| 7,697,915 B2 | 4/2010 | Behzad et al. | |
| 7,804,361 B2 | 9/2010 | Lim et al. | |
| 7,957,472 B2 | 6/2011 | Wu et al. | |
| 8,000,664 B2 | 8/2011 | Khorram | |
| 8,030,999 B2 | 10/2011 | Chatterjee et al. | |
| 8,106,806 B2 | 1/2012 | Toyomura et al. | |
| 8,159,375 B2 | 4/2012 | Abbasfar | |
| 8,159,376 B2 | 4/2012 | Abbasfar | |
| 8,183,930 B2 | 5/2012 | Kawakami et al. | |
| 8,547,272 B2 | 10/2013 | Nestler et al. | |
| 8,581,824 B2 | 11/2013 | Baek et al. | |
| 8,604,879 B2 | 12/2013 | Mourant et al. | |
| 8,643,437 B2 | 2/2014 | Chiu et al. | |
| 8,674,861 B2 | 3/2014 | Matsuno et al. | |
| 8,687,968 B2 | 4/2014 | Nosaka et al. | |
| 8,791,735 B1 | 7/2014 | Shibasaki | |
| 8,841,936 B2 | 9/2014 | Nakamura | |
| 8,860,590 B2 | 10/2014 | Yamagata et al. | |
| 9,069,995 B1 | 6/2015 | Cronie | |
| 9,106,465 B2 | 8/2015 | Walter | |
| 9,148,087 B1 * | 9/2015 | Tajalli | H03F 1/0205 |
| 9,178,503 B2 | 11/2015 | Hsieh | |
| 9,281,785 B2 | 3/2016 | Sjöland | |
| 9,292,716 B2 | 3/2016 | Winoto et al. | |
| 9,300,503 B1 | 3/2016 | Holden et al. | |
| 10,003,315 B2 | 6/2018 | Tajalli | |
| 2001/0006538 A1 | 7/2001 | Simon et al. | |
| 2002/0050861 A1 | 5/2002 | Nguyen et al. | |
| 2002/0149508 A1 | 10/2002 | Hamashita | |
| 2002/0158789 A1 | 10/2002 | Yoshioka et al. | |
| 2002/0174373 A1 | 11/2002 | Chang | |
| 2003/0016763 A1 | 1/2003 | Doi et al. | |
| 2003/0085763 A1 | 5/2003 | Schrodinger et al. | |
| 2003/0132791 A1 | 7/2003 | Hsieh | |
| 2003/0160749 A1 | 8/2003 | Tsuchi | |
| 2003/0174023 A1 | 9/2003 | Miyasita | |
| 2003/0184459 A1 | 10/2003 | Engl | |
| 2003/0218558 A1 | 11/2003 | Mulder | |
| 2004/0027185 A1 | 2/2004 | Fiedler | |
| 2004/0169529 A1 | 9/2004 | Afghani et al. | |
| 2005/0057379 A1 | 3/2005 | Jansson | |
| 2005/0270098 A1 | 12/2005 | Zhang et al. | |
| 2006/0036668 A1 | 2/2006 | Jaussi et al. | |
| 2006/0097786 A1 | 5/2006 | Su et al. | |
| 2006/0103463 A1 | 5/2006 | Lee et al. | |
| 2006/0192598 A1 | 8/2006 | Baird et al. | |
| 2006/0194598 A1 | 8/2006 | Kim et al. | |
| 2007/0009018 A1 | 1/2007 | Wang | |
| 2007/0176708 A1 | 8/2007 | Otsuka et al. | |
| 2007/0182487 A1 | 8/2007 | Ozasa et al. | |
| 2007/0188367 A1 | 8/2007 | Yamada | |
| 2007/0201546 A1 | 8/2007 | Lee | |
| 2008/0001626 A1 | 1/2008 | Bae et al. | |
| 2008/0165841 A1 | 7/2008 | Wall et al. | |
| 2008/0187037 A1 | 8/2008 | Bulzacchelli et al. | |
| 2009/0090333 A1 | 4/2009 | Spadafora et al. | |
| 2009/0115523 A1 | 5/2009 | Akizuki et al. | |
| 2009/0323864 A1 | 12/2009 | Tired | |
| 2010/0148819 A1 | 6/2010 | Bae et al. | |
| 2010/0156691 A1 | 6/2010 | Taft | |
| 2010/0219781 A1 | 9/2010 | Kuwamura | |
| 2010/0235673 A1 | 9/2010 | Abbasfar | |
| 2010/0271107 A1 | 10/2010 | Tran et al. | |
| 2011/0028089 A1 | 2/2011 | Komori | |
| 2011/0032977 A1 | 2/2011 | Hsiao et al. | |
| 2011/0051854 A1 | 3/2011 | Kizer et al. | |
| 2011/0057727 A1 | 3/2011 | Cranford et al. | |
| 2011/0096054 A1 | 4/2011 | Cho et al. | |
| 2011/0103508 A1 | 5/2011 | Mu et al. | |
| 2011/0133816 A1 | 6/2011 | Wu et al. | |
| 2011/0156819 A1 | 6/2011 | Kim et al. | |
| 2012/0025911 A1 | 2/2012 | Zhao et al. | |
| 2012/0044021 A1 | 2/2012 | Yeh et al. | |
| 2012/0133438 A1 | 5/2012 | Tsuchi et al. | |
| 2013/0106513 A1 | 5/2013 | Cyrusian et al. | |
| 2013/0114663 A1 | 5/2013 | Ding et al. | |
| 2013/0147553 A1 | 6/2013 | Iwamoto | |
| 2013/0195155 A1 | 8/2013 | Pan et al. | |
| 2013/0215954 A1 | 8/2013 | Beukema et al. | |
| 2013/0259113 A1 | 10/2013 | Kumar | |
| 2013/0334985 A1 | 12/2013 | Kim et al. | |
| 2014/0119479 A1 | 5/2014 | Tajalli | |
| 2014/0176354 A1 | 6/2014 | Yang | |
| 2014/0177696 A1 | 6/2014 | Hwang | |
| 2014/0203794 A1 | 7/2014 | Pietri et al. | |
| 2014/0266440 A1 | 9/2014 | Itagaki et al. | |
| 2014/0312876 A1 | 10/2014 | Hanson et al. | |
| 2015/0070201 A1 | 3/2015 | Dedic et al. | |
| 2015/0146771 A1 | 5/2015 | Walter | |
| 2015/0198647 A1 | 7/2015 | Atwood et al. | |
| 2016/0013954 A1 * | 1/2016 | Shokrollahi | H04L 25/0272 375/257 |
| 2016/0197747 A1 | 7/2016 | Ulrich et al. | |
| 2017/0085239 A1 | 3/2017 | Yuan et al. | |
| 2017/0104458 A1 | 4/2017 | Cohen et al. | |
| 2017/0214374 A1 * | 7/2017 | Tajalli | H04L 25/03057 |
| 2019/0199557 A1 | 6/2019 | Taylor et al. | |

OTHER PUBLICATIONS

Schneider, J., et al., "ELEC301 Project: Building an Analog Computer", http://www.clear.rice.edu/elec301/Projects99/anlgcomp/, Dec. 19, 1999, (9 pages).

Tierney, J., "A Digital Frequency Synthesizer", Audio and Electroacoustics, IEEE Transactions, pp. 48-57, vol. 19, No. 1, Abstract, Mar. 1971, (1 page).

International Search Report and Written Opinion for PCT/US2019/036170, dated Aug. 19, 2019, 1-14 (14 pages).

Kim, Kyu-Young, et al., "8 mW 1.65-Gbps continuous-time equalizer with clock attenuation detection for digital display interface", Analog Integrated Circuits and Signal Processing, Kluwer Academic Publishers, vol. 63, No. 2, Oct. 11, 2009, 329-337 (9 pages).

Takahashi, Masayoshi, et al., "A 2-GHz Gain Equalizer for Analog Signal Transmission Using Feedforward Compensation by a Low-Pass Filter", IEICE Transactions on Fundamentals of Electronics, vol. E94A, No. 2, Feb. 2011, 611-616 (6 pages).

(56) References Cited

OTHER PUBLICATIONS

Wang, Hui, et al., "Equalization Techniques for High-Speed Serial Interconnect Transceivers", Solid-State and Integrated-Circuit Technology, 9th International Conference on ICSICT, Piscataway, NJ, Oct. 20, 2008, 1-4 (4 pages).

Palmisano, G., et al., "A Replica Biasing for Constant-Gain CMOS Open-Loop Amplifiers", Circuits and Systems, IEEE International Symposium in Monterey, CA, May 31, 1998, 363-366 (4 pages).

* cited by examiner

PASSIVE MULTI-INPUT COMPARATOR FOR ORTHOGONAL CODES ON A MULTI-WIRE BUS

CROSS-REFERENCE TO RELATED APPLICATIONS

This application claims the benefit of U.S. Provisional Application No. 62/684,538, filed Jun. 13, 2018, entitled "Passive Multi-Input Comparator for Orthogonal Codes on a Multi-Wire Bus", and claims the benefit of U.S. Provisional Application No. 62/683,955, filed Jun. 12, 2018, entitled "Passive Multi-Input Comparator for Orthogonal Codes on a Multi-Wire Bus", all of which are hereby incorporated by reference in their entirety for all purposes.

REFERENCES

The following prior applications are herein incorporated by reference in their entirety for all purposes:

U.S. Pat. No. 9,288,089, filed May 20, 2010 as application Ser. No. 12/784,414 and issued Mar. 15, 2016, naming Harm Cronie and Amin Shokrollahi, entitled "Orthogonal Differential Vector Signaling", hereinafter identified as [Cronie].

U.S. patent application Ser. No. 13/842,740, filed Mar. 15, 2013, naming Brian Holden, Amin Shokrollahi, and Anant Singh, entitled "Methods and Systems for Skew Tolerance in and Advanced Detectors for Vector Signaling Codes for Chip-to-Chip Communication", hereinafter identified as [Holden].

U.S. Pat. No. 9,100,232, filed Feb. 2, 2015 as application Ser. No. 14/612,241, and issued Aug. 4, 2015, naming Ali Hormati, Amin Shokrollahi, and Roger Ulrich, entitled "Method for Code Evaluation using ISI Ratio", hereinafter identified as [Hormati I].

U.S. patent application Ser. No. 15/582,545, filed Apr. 28, 2017, naming Ali Hormati and Richard Simpson, entitled "Clock Data Recovery with Decision Feedback Equalization" hereinafter identified as [Hormati II].

BACKGROUND

In communication systems, a goal is to transport information from one physical location to another. One common information transfer medium is the serial communications link, which may be based on a single wire circuit relative to ground or other common reference, multiple such circuits relative to ground or other common reference, or multiple circuits used in relation to each other. A common example of the latter uses differential signaling ("DS"). Differential signaling operates by sending a signal on one wire and the opposite of that signal on a matching wire. The signal information is represented by the difference between the wires, rather than their absolute values relative to ground or other fixed reference. Vector signaling is another such example. With vector signaling, a plurality of signals on a plurality of wires are considered collectively, although each of the plurality of signals might be independent. With binary vector signaling, each component or "symbol" of the vector takes on one of two possible values. With non-binary vector signaling, each symbol has a value that is a selection from a set of more than two possible values. Any suitable subset of a vector signaling code denotes a "subcode" of that code. Such a subcode may itself be a vector signaling code.

BRIEF DESCRIPTION

A detection matrix is described for an Orthogonal Differential Vector Signaling code in which passive resistor networks are used to sum at least some of the input terms of that code before active detection of a subchannel result. Such passive summation can reduce the detrimental effects of common mode signal variation and increase the dynamic range of the resulting detector.

Methods and systems are described for receiving a plurality of signals via a plurality of wires of a multi-wire bus, the plurality of signals corresponding to symbols of a codeword of a vector signaling code, generating, using an interconnected resistor network connected to the plurality of wires of the multi-wire bus, a plurality of combinations of the symbols of the codeword of the vector signaling code on a plurality of output nodes, the plurality of output nodes including a plurality of pairs of sub-channel output nodes associated with respective sub-channels of a plurality of sub-channels, and generating a plurality of sub-channel outputs using a plurality of differential transistor pairs, each differential transistor pair of the plurality of differential transistor pairs connected to a respective pair of sub-channel output nodes of the plurality of pairs of sub-channel output nodes.

DETAILED DESCRIPTION

Figure 1:
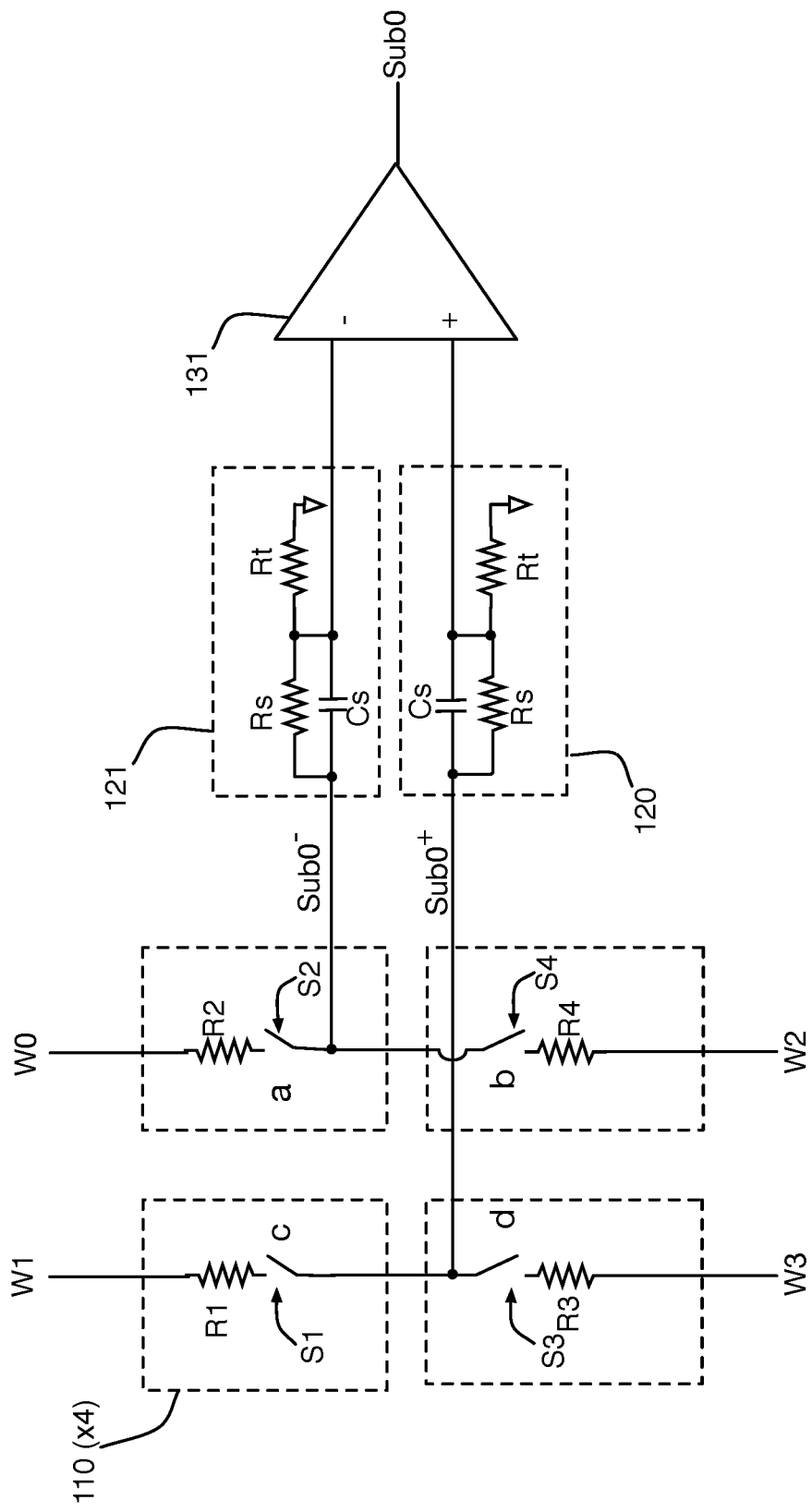
FIG. 1 is a circuit diagram of an ODVS subchannel detector incorporating a passive multi-input comparator (MIC), in accordance with some embodiments.

Orthogonal Differential Vector Signaling codes (ODVS) are described [Cronie] as being particularly suited to use in high-speed multiwire communication systems. In one interpretation, ODVS is described as a word-oriented encoding/decoding method providing improved performance and robustness; data words are encoded into ODVS codewords for transmission essentially in parallel on multiple signal wires, one such codeword per unit interval, with the receiver subsequently detecting those codewords and decoding them so as to recover the data. In an alternative view, each ODVS codeword may be interpreted as a weighted summation of multiple independent (e.g. orthogonal) sub-channel vectors, each sub-channel vector modulated by a corresponding data signal of the overall data word composed of multiple data signals being transmitted.

In some embodiments, an ODVS code is described and defined by a matrix. Each row of the matrix may be interpreted as a sub-channel vector of elements that may be weighted by a corresponding signal element, with each column representing one wire of the multiwire communications channel. An individual wire signal may thus contribute to multiple sub-channels in various combinations with other wire signals.

Without implying limitation, the H4 code of [Cronie], also known as the Ensemble Non-Return-to-Zero or ENRZ code, will be used in the subsequent examples. ENRZ encodes three data bits for transmission over a four-wire channel. Its defining matrix is:

$$H_4 = \begin{bmatrix} +1 & +1 & +1 & +1 \\ +1 & -1 & +1 & -1 \\ +1 & +1 & -1 & -1 \\ +1 & -1 & -1 & +1 \end{bmatrix} \quad \text{(Eqn. 1)}$$

and encoding of the three bits $D_0$, $D_1$, $D_2$ may be obtained by multiplying the data bits by rows 2-4 of the Hadamard matrix H4 to obtain four output values. In such an embodiment, each row of the rows 2-4 of the matrix of Eqn. 1 corresponds to a respective sub-channel vector of a plurality of sub-channel vectors. Each sub-channel vector being modulated, or weighted, by a respective data bit (taking values of +1 or −1) corresponds to a modulated sub-channel. A sum of all of the modulated sub-channels produces a codeword of a vector signaling code. In the word-oriented view, the three-bit data word D<2:0> is multiplied by rows 2-4 of the above matrix to encode the data into a four value codeword composed of values [A, B, C, D]. An offset may be added to each codeword value for ease in transmission along the multi-wire bus medium. Because the first "all-ones" row of the matrix is not used, the resulting codewords of the ENRZ code are balanced, all symbols of a given codeword summing to zero (or a constant when an offset is added), and are either permutations of the vector [+1, −⅓, −⅓, −⅓] or [−1, +⅓, +⅓, +⅓]. Thus, physical wire signals corresponding to a series of ENRZ codewords may take on four distinct values.

In some embodiments, the uppermost vector of the matrix is described as corresponding to common mode signaling, which is not used herein. Thus, each of the sub-channel vectors corresponding to rows 2-4 of the matrix are multiplied (or modulated) by a corresponding data bit of the set of data bits $D_0$, $D_1$, $D_2$ to produce three modulated sub-channels, which are summed together to produce symbols A, B, C, D, of the codeword to transmit over wires of a multi-wire bus.

As described by [Cronie], ODVS may be decoded by multiplication of the received signals by a decoding matrix. In some embodiments, the decoding matrix may correspond to the encoding matrix, or alternatively an inverse of the encoding matrix. As described in [Cronie], "Sylvester Hadamard matrices" are symmetric, which means they are identical to their inverses. [Holden] further teaches that one efficient means of performing this operation uses Multi-Input Comparators (MICs). Each MIC computes a linear combination of weighted input signals where the weights at a given MIC are determined by a corresponding sub-channel vector in the detection matrix, with the output of each MIC corresponding to an antipodal sub-channel output representing the input data at the transmitter. Thus, binary data encoded onto an ENRZ channel will result in an antipodal (i.e. a single "eye" opening) MIC output that may be sampled using conventional binary signal detection methods. A set of MICs that detect the plurality of ENRZ sub-channels may be described by equations 2-4 below:

$$Sub_0 = (W1+W3)-(W0+W2) \quad \text{(Eqn. 2)}$$

$$Sub_1 = (W0+W3)-(W1+W2) \quad \text{(Eqn. 3)}$$

$$Sub_2 = (W2+W3)-(W0+W1) \quad \text{(Eqn. 4)}$$

where wire signals W0, W1, W2, W3 represent individual columns [Holden] further teaches that these equations may be efficiently implemented in analog logic as three instances of a four-input differential amplifier, the described embodiment having multiple transistor inputs producing two inverting and two non-inverting terms of equal weight that are actively summed to the desired result.

MIC embodiments that rely on active input elements may have issues with signal dynamic range and/or common mode rejection. The latter may be a significant problem with ODVS codes such as ENRZ, as modulation of one subchannel can present as a varying common mode offset in other sub-channels.

A passive MIC embodiment is presented which avoids these issues. Rather than using active circuit components to buffer and isolate the input signals before the analog computation, a passive interconnected resistor network performs the combinations of the symbols of the codeword on a plurality of pairs of sub-channel output nodes prior to a conventional differential signal receiver or amplifier. In at least one embodiment, an interconnected resistor network may include three identical instances of a resistor network each being driven by a respective input permutation of input signals to provide differential outputs on a respective pair of sub-channel output nodes that are provided to respective signal receivers/differential amplifiers, which in turn generate three sub-channel outputs. FIG. 1 is a schematic of one particular sub-channel receiver for detecting one sub-channel of the example ENRZ code, in accordance with some embodiments.

Figure 2:
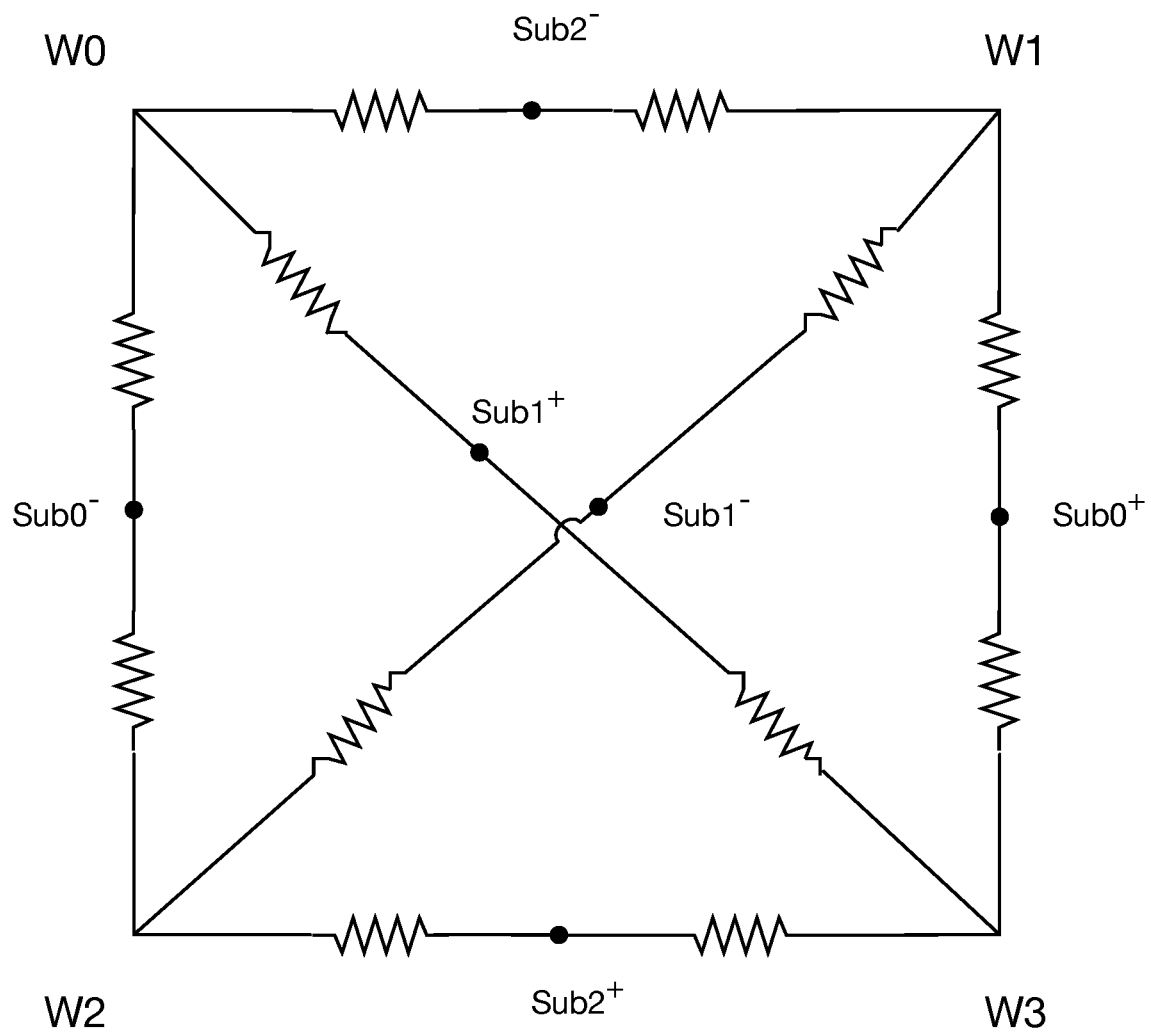
FIG. 2 is a schematic of an interconnected resistor network in a passive MIC, in accordance with some embodiments.

FIG. 2 illustrates an interconnected resistor network in accordance with some embodiments. As shown, the interconnected resistor network is connected to a plurality of wires of a multi-wire bus carrying signals corresponding to symbols of a codeword of a vector signaling code. In the description below, the notation W0-W3 may correspond to the wires of the multi-wire bus, the wire signals carried on said wires, or may be used to refer to the symbols of the codeword of the vector signaling code. The interconnected resistor network is configured to receive the wire signals corresponding to the symbols of the codeword of the vector signaling code and to responsively generate combinations (e.g., combination of symbols $Sub_0^+$) of the symbols of the codeword of the vector signaling code on a plurality of output nodes. As shown in FIG. 2, the plurality of output nodes includes a plurality of pairs of sub-channel output nodes associated with respective sub-channels of a plurality of sub-channels. The pair of output nodes $Sub_0^+$ and $Sub_0^-$ are grouped to form a pair of sub-channel output nodes for sub-channel $Sub_0$, while pairs of output nodes $Sub_1^-/Sub_1^-$ and $Sub_2^+/Sub_2^-$ are grouped to form pairs of sub-channel output nodes for sub-channels $Sub_1$ and $Sub_2$, respectively as defined above in Eqns. 2-4. The interconnected resistor network is connected to a plurality of differential transistor pairs (e.g., respective instances of differential amplifier 131 in FIG. 1), each differential transistor pair of the plurality of differential transistor pairs connected to a respective pair of sub-channel output nodes of the plurality of pairs of sub-channel output nodes and configured to generate a respective sub-channel output of a plurality of sub-channel outputs.

FIG. 1 is a block diagram of a sub-channel receiver configured for detecting sub-channel $Sub_0$, in accordance with some embodiments. In FIG. 1, the wire signals are labeled W0, W1, W2, W3, corresponding to the symbols of the codeword A, B, C, D of, in this example, sub-channel $Sub_0$ defined by Eqn. 2. In at least one embodiment, the wire signals are received without additional amplification or signal processing. In other embodiments, the wire signals may be the outputs of conventional variable gain amplifiers (VGA), continuous-time linear equalizers (CTLE), or other active processing elements.

Figure 3:
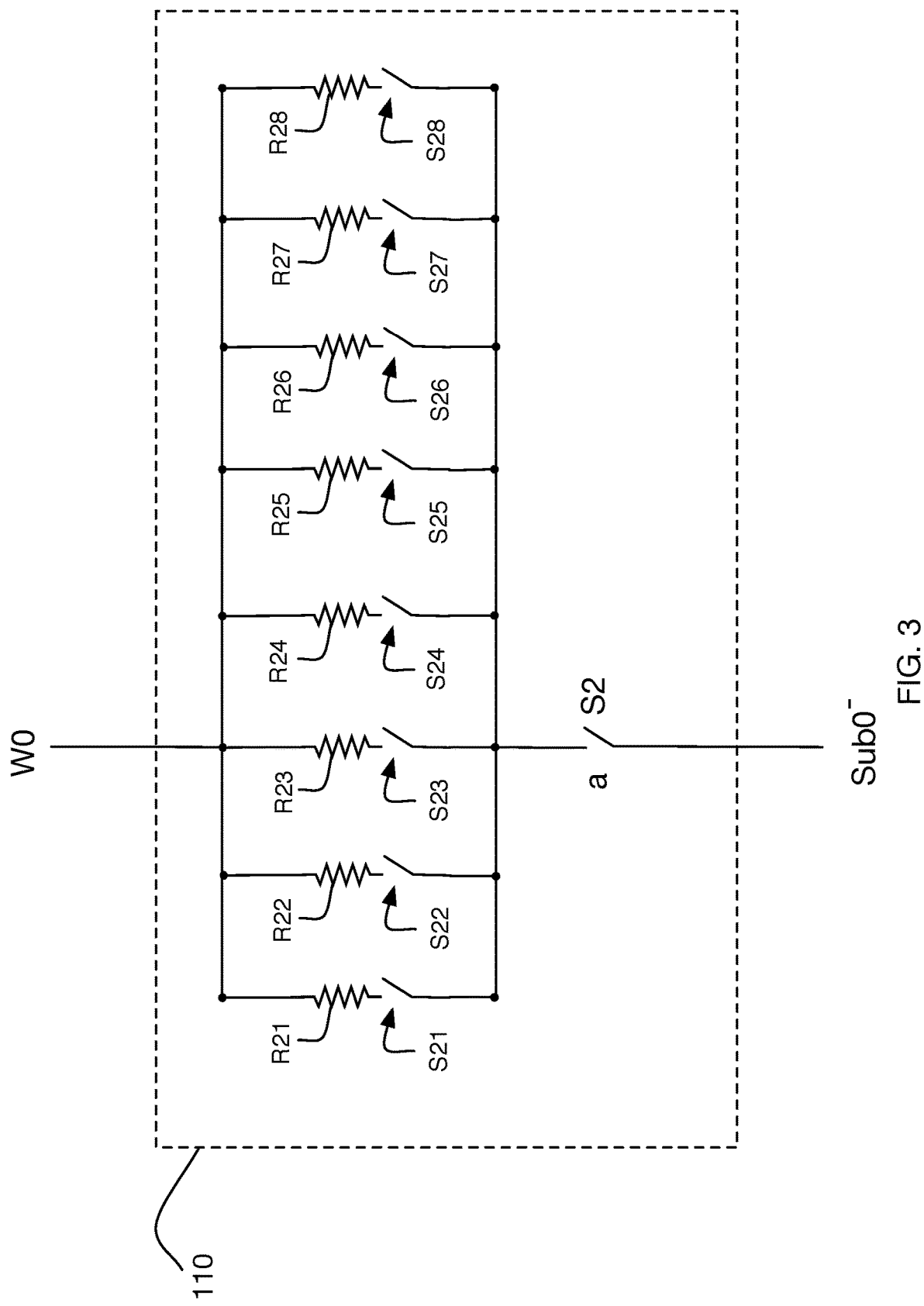
FIG. 3 is a circuit diagram of a tunable resistor array for selectively enabling a number of resistive elements, in accordance with some embodiments.

As a first example of ENRZ detection of subchannel $Sub_0$ with the circuit of FIG. 1, switches S1, S2, S3, S4 in series with resistors R1, R2, R3, R4 are all presumed to be closed. In some embodiments, the resistors R1-R4 are all equal valued. In some embodiments, the impedance values of resistors R1-R4 may be tunable, as illustrated in FIG. 3 and described in more detail below. Input signals on wires W1 and W3 are passively summed by resistors R1 and R3 to produce a combination of symbols $Sub_0^+$ on a first output node of a pair of sub-channel output nodes associated with sub-channel $Sub_0$, and input signals on wires W0 and W2 are passively summed by resistors R2 and R4 to produce a combination of symbols $Sub_0^-$ on a second output node of the pair of sub-channel output nodes associated with sub-channel $Sub_0$. The combination of symbols $Sub_0^+$ may be passed through filtering circuit 120 to the positive or non-inverting input of differential amplifier 131, and the combination of symbols $Sub_0^-$ is passed through filtering circuit 121 to the negative or inverting input of differential amplifier 131. In the scenario where the value of each of resistors R1, R2, R3, R4 is equal, the signals are summed with equal weights. It should be noted that using unequaled value may provide a summation using unequal weights in the scenario where a matrix having multiple magnitudes of weights is used. [Hormati I] discloses some such matrices having multiple magnitudes of weights, e.g., the Glasswing matrix.

Identical filtering circuits 120 and 121, shown here as being composed of elements Rs and Cs, connected to a termination resistor Rt, provides frequency-dependent filtering and signal termination, in accordance with some embodiments. In one example embodiment, the combination of input series impedance (e.g. R1 paralleled with R3, etc.), Rs, and Cs provide a high frequency peaking effect. while Rt provides a termination impedance for the input signal. Such filtering may be useful for clock and data recovery or CTLE, where rounded (e.g., low-pass filtered) transitions are desirable to use transition samples for generating a phase-error signal used to update a voltage-controlled oscillator (VCO). The CDR disclosed in [Hormati II] utilizing DFE may benefit from such filtering to provided more rounded eyes when utilizing speculative DFE samples as phase error information. In some embodiments, by adjusting the impedances of resistors R1-R4, the cutoff frequency of the low-pass filter may be adjusted, as described in more detail below with respect to FIG. 3.

In one embodiment, 131 is a differential linear amplifier performing the subtraction operation of Eqn. 2, thus sub-channel output $Sub_0$ is an analog signal representing a respective data signal provided to the transmitter. In another embodiment, 131 is a differential comparator performing the subtraction operation by generating an analog antipodal value followed by an amplitude slicing operation, resulting in a binary digital sub-channel output corresponding to the binary data value used to modulate the sub-channel. In further embodiments, 131 may additionally incorporate clocked or dynamic sampling elements, capturing the state of the analog or digital result at a desired time.

The circuit of FIG. 1 acts as a multi-mode sub-channel receiver configurable for operating in various modes in addition to the ODVS mode previously described. For example, in a second or "legacy" mode, the circuit of FIG. 1 may be configured to operate as a legacy differential receiver data detector. Such an embodiment may be configured by closing switches S1 and S2 (via control signals c and a respectively) and opening switches S3 and S4 (via control signals d and b respectively); thus, signals $Sub_0^+$ and $Sub_0^-$ reflect only wire signals W0 and W1, which are used as a conventional differential signal pair.

In some embodiments, the circuit may operate in a third mode, where all of the switches S1, S2, S3, S4 are opened to isolate wires W0, W1, W2, W3 from the loading effects of the subchannel receiver. Such a configuration may be used for example during a transmit (Tx) mode of operation in which other system components drive the wires in the opposite direction. In such an embodiment, every sub-channel receiver may be fully disconnected from the wires of the multi-wire bus. Alternatively, a single sub-channel receiver may be disconnected from the multi-wire bus, while the other two sub-channel receivers operate on respective differential signals, as described above.

Typically, switches S1, S2, S3, S4 are implemented using MOS transistors controlled by digital mode control signals e.g., a,b,c,d as well known in the art. The schematics of FIGS. 4-6 exemplify such embodiments. In some environments multiple-transistor transmission gates may be preferred instead of MOS transistors to provide additional signal headroom or reduced distortion. The sub-channel receivers of FIG. 1 and the resistor networks in FIGS. 4-6 include switches for supporting multiple modes of operation, however, some embodiments may omit such switches by shorting the terminals connected to the switches, such as the interconnected resistor network of FIG. 2.

Figure 5:
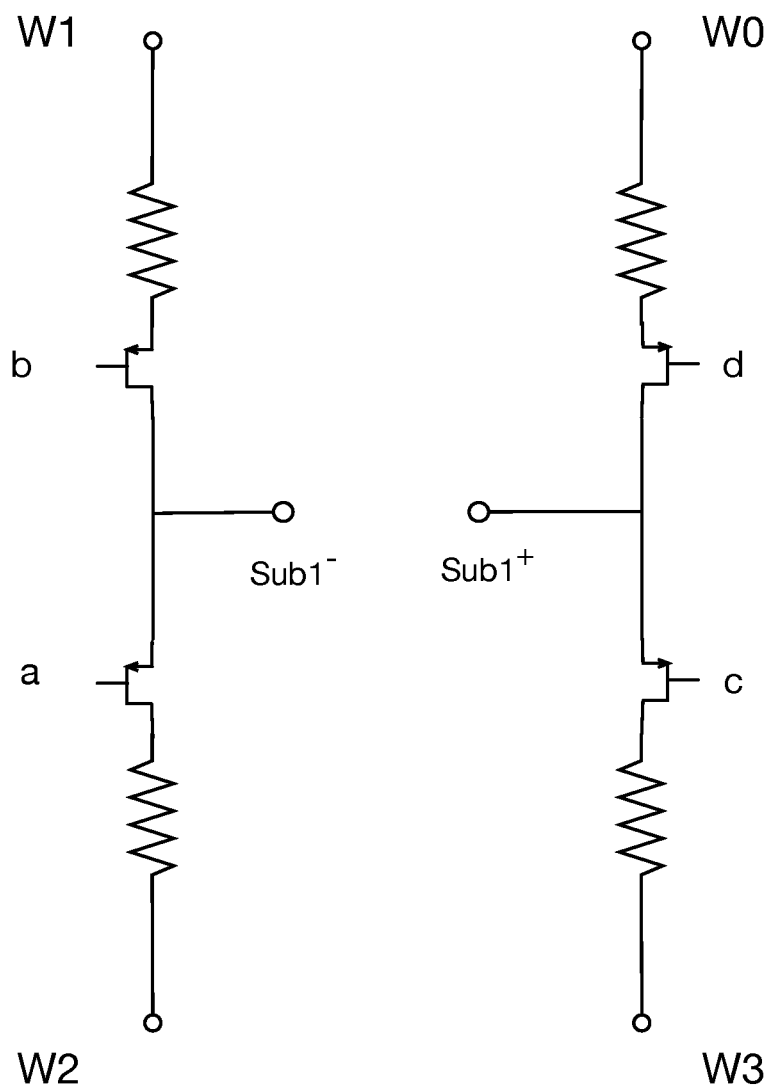

Sub-channel receivers for subchannels $Sub_1$ and $Sub_2$ may be identical to FIG. 1 except for the order in which wire signals are connected to input resistors. As illustrated in FIG. 5, $Sub_1$ combines wire signals corresponding to symbols on wires W0 and W3 be combined to produce interim signal $Sub_1^+$ and W1 and W2 be combined to produce $Sub_1^-$. Similarly, FIG. 6 illustrates that wire signals corresponding to symbols on wires W2 and W3 produce $Sub_2^+$, and W0 and W1 to produce $Sub_2^-$.

Figure 4:
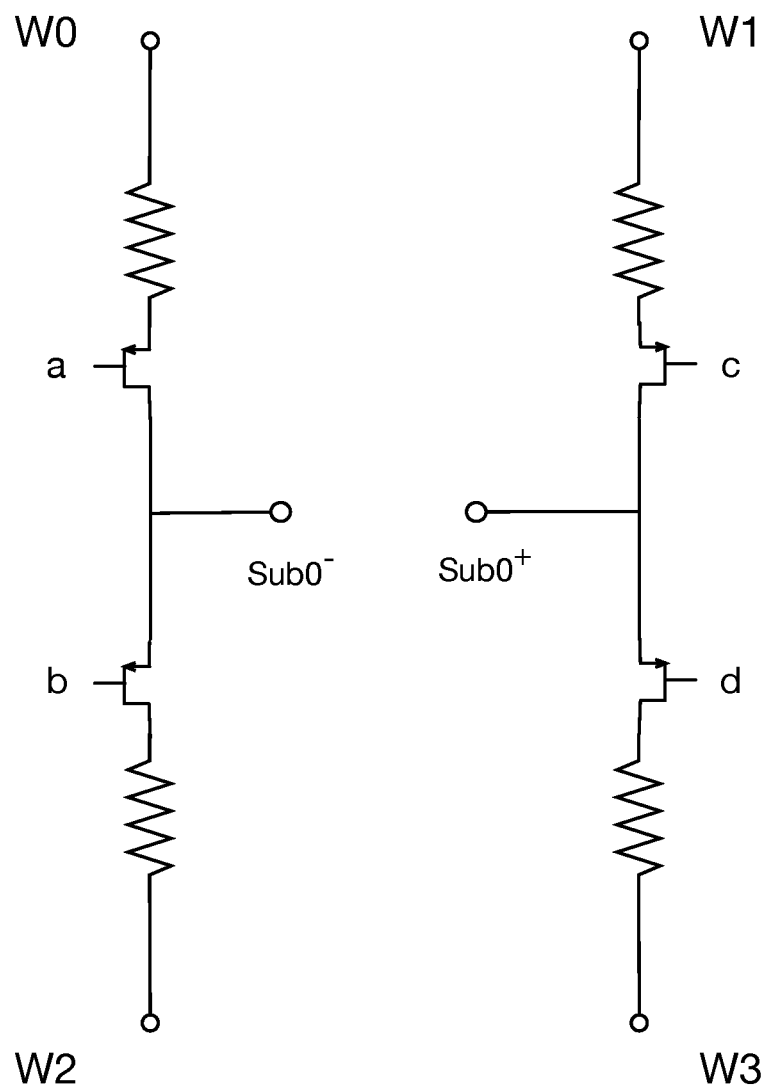
FIGS. 4-6 are schematics of sub-channel specific portions of the interconnected resistor network configurable to operate in a multi-mode system, in accordance with some embodiments.
Figure 6:
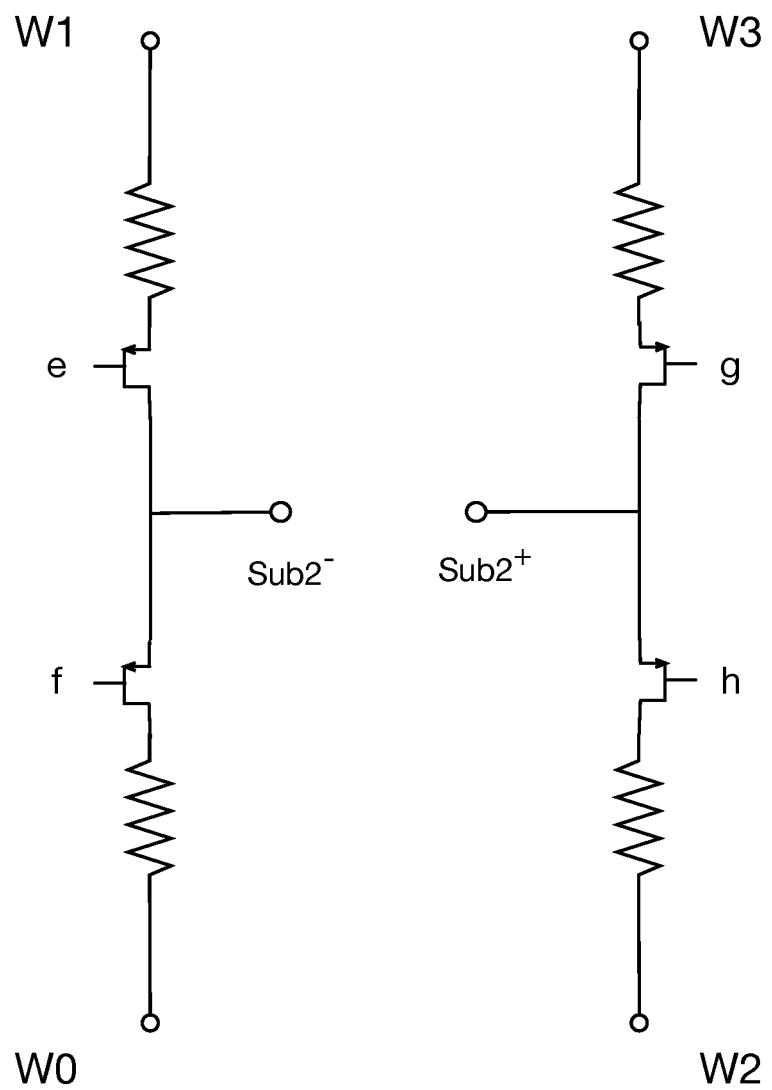
Figure 7:
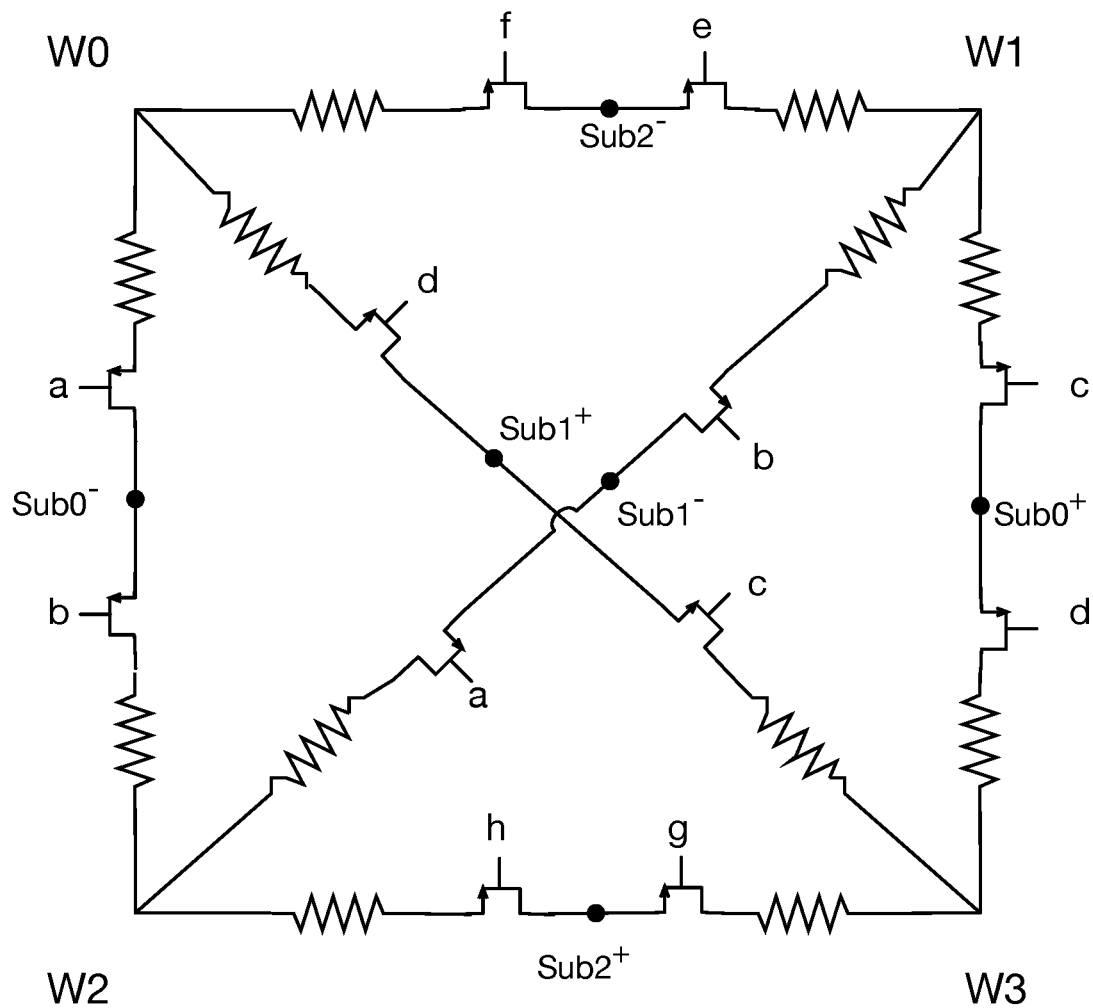
FIG. 7 is a schematic of the interconnected resistor network including switching devices for operating in a multi-mode system, in accordance with some embodiments.
Figure 9:
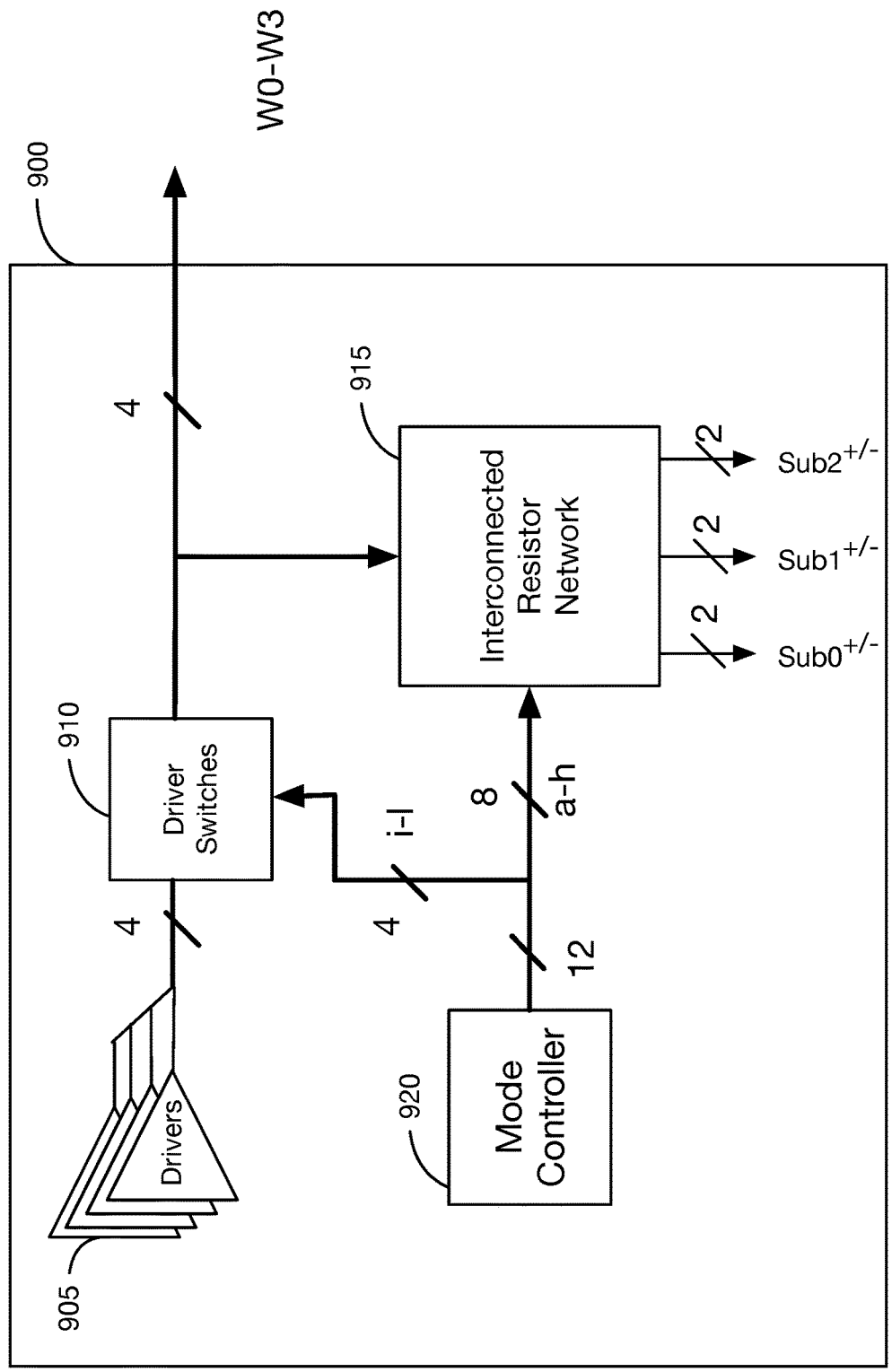
FIG. 9 is a block diagram of for configuring a transceiver in a Tx or RX mode of operation, in accordance with some embodiments.
Figure 10:
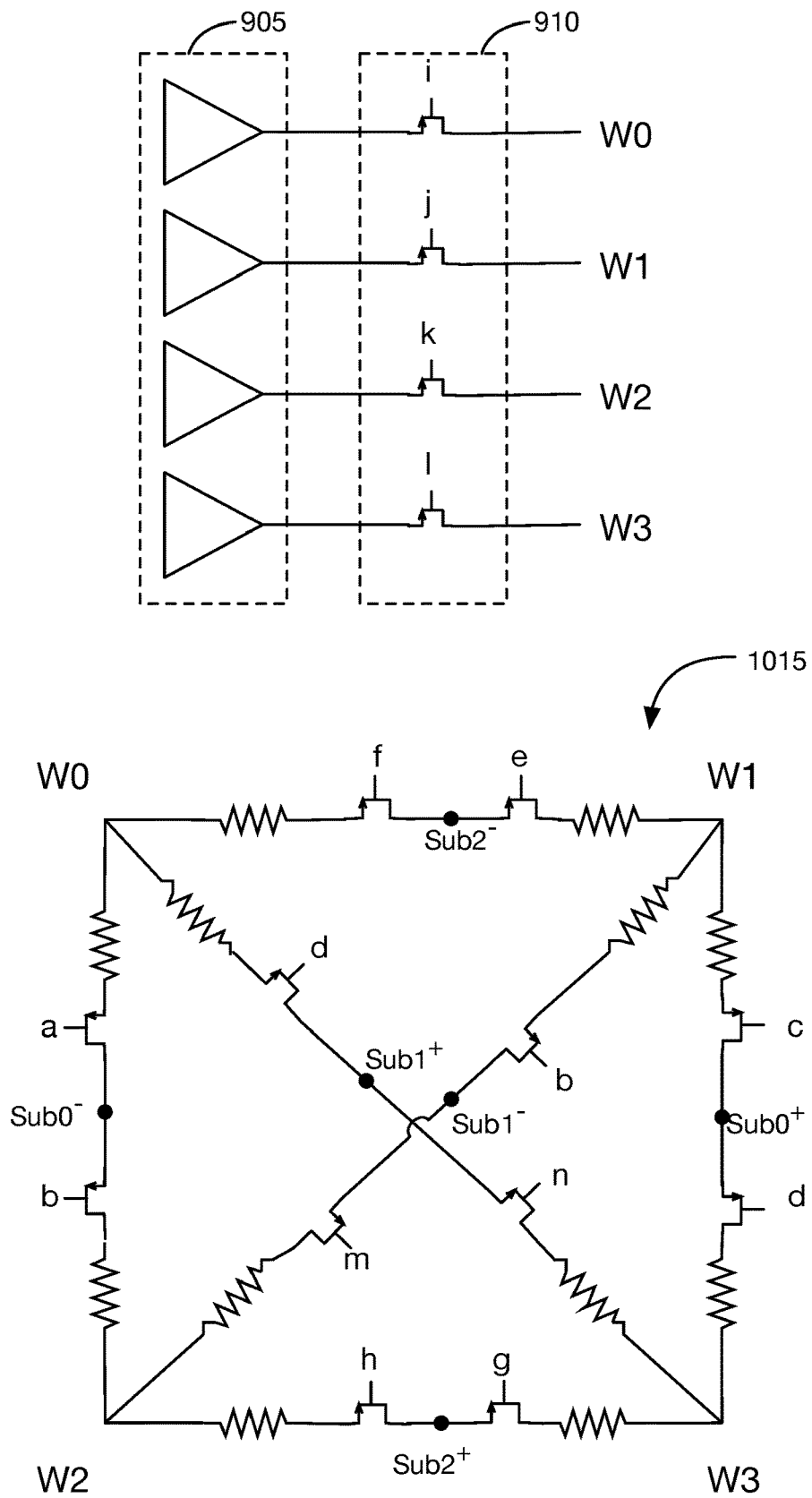
FIG. 10 is a block diagram of a transceiver operating in a full-duplex mode of operation, in accordance with some embodiments.

FIGS. 4-6 illustrate resistor and switching networks for sub-channels $Sub_{0-2}$, respectively. As shown, each resistor network receives mode control signals to control corresponding switches. In the following example, all three sub-channel receivers may operate in either an ODVS mode where wire signals are combined on pairs of sub-channel output nodes, or alternatively a "legacy" mode may be initiated, in which sub-channel receivers Sub0 and Sub1 are configured to receive respective differential pairs signals, and sub-channel receiver Sub2 is turned off (e.g., disconnected from the bus). Table I below defines two such operation modes. In the first mode, all switches are enabled, and the pairs of sub-channel output nodes produce sub-channel outputs corresponding to detected ODVS sub-channels in accordance with Eqns. 2-4 described above. In the second mode, switches controlled by mode control signals a and c are enabled, and all other switches are disabled. In such an embodiment, a differential output between the wire signals on wires W1 and W0 is generated on the pair of sub-channel output nodes associated with sub-channel Sub0 and a differential output between the wire signals on wires W3 and W2 is generated on the pair of sub-channel output nodes associated with sub-channel Sub1. FIG. 7 illustrates the interconnected resistor network of FIG. 2 additionally including the mode selection switches for enabling multi-mode operation. In a third mode, or Tx mode, the entire interconnected resistor network is disconnected to isolate the receive circuitry, and transmit drivers are connected to the wires. In a fourth mode, or full duplex mode, the interconnected resistor network is connected to two wires of the multi-wire bus to obtain a differential signal, while the remaining two wires may be connected to transmit drivers to transmit a differential signal. Table I below and FIGS. 9-10 illustrate such further modes.

driver mode control signals. In a full Tx mode, the interconnected resistor network 915 may be fully disconnected from the multi-wire bus, while each driver is connected to a respective wire, and wire signals are driven onto the multi-wire bus. In some embodiments, a full-duplex mode may be configured, in which an inbound differential signal received via wires W0 and W1 is compared, and outbound signals are transmitted on wires W2 and W3 via the corresponding transmit drivers. Such an embodiment may utilize additional mode control signals, as control signals a and c would not be re-usable in the configuration shown in FIG. 7. In such embodiments, the MOS switches connecting wires W2 and W3 to sub-channel output nodes $Sub_1^-$ and $Sub_1^+$ respectively, may receive control signals m and n. FIG. 10 illustrates a configuration of driver switches 910 utilizing 4 mode control signals i-l and an interconnected resistor network 1015 utilizing 10 mode control signals a-h, m, n for operating in such a full-duplex mode.

TABLE I

| Control Signal Configuration | $Sub_0^+ - Sub_0^-$ | $Sub_1^+ - Sub_1^-$ | $Sub_2^+ - Sub_2^-$ |
|---|---|---|---|
| a = b = c = d = e = f = g = h = '1' | (W1 + W3) − (W0 + W2) | (W0 + W3) − (W1 + W2) | (W2 + W3) − (W0 + W1) |
| a = c = '1'; b = d = e = f = g = h = '0' | W1 − W0 | W3 − W2 | N/A |
| a = b = c = d = e = f = g = h = '0'; i = j = k = l = '1' | N/A (Tx Mode) | N/A (Tx Mode) | N/A (Tx Mode) |
| a = c = k = l = '1'; b = d = e = f = g = h = i = j = m = n = '0' | W1 − W0 (Full Duplex) | N/A (Full Duplex) | N/A (Full Duplex) |

In some embodiments, as described above, the interconnected resistor network is part of a transceiver that includes multiple drivers for driving symbols onto the wires of the multi-wire bus. In such an embodiment, the drivers and interconnected resistor network may be selectively connected to the multi-wire bus in a Tx mode, or one of the multiple Rx modes described above, e.g., ODVS and differential signaling or "legacy" mode. FIG. 9 is a block diagram of a transceiver 900, in accordance with some embodiments. As shown, the transceiver 900 includes a plurality of transmit drivers 905, and an interconnected resistor network 915 as previously described. In some embodiments, transceiver 900 may further include an encoder (not shown) configured to receive a set of input data and to responsively provide control signals to the drivers to generate the symbols of the codeword of the vector signal code on the multi-wire bus. The transceiver further includes a mode controller 920 that may be used to provide the multi-bit mode control signal based on a selected mode. In the transceiver 900 of FIG. 9, the multi-bit mode control signal is composed of 8 signals a-h used to control the switches in interconnected resistor network 915 as described above and shown in FIG. 7, as well as four additional signals i, j, k, l that are provided to a set of driver switches 910. In some embodiments, each signal i-l may be provided to a respective driver switch that is configured to connect or disconnect a corresponding driver to the corresponding wire of the multi-wire bus. Specifically, signal i may be provided to the driver associated with wire W0; signal j may be provided to the driver associated with wire W1; signal k may be provided to the driver associated with wire W2; and signal l may be provided to the driver associated with wire W3. Table I includes two additional modes utilizing such In some embodiments, the amount of high frequency peaking provided by circuit 121 may be varied by changing the effective input series impedance of the wire signals. In one particular further embodiment, each of the resistor/switch combinations 110 of FIG. 1 (one example being R1 and S1,) are embodied as multiple paralleled sets of series resistors and switches as illustrated in FIG. 3. As one example offered without limitation, resistors R21 through R28 are each of value 8*R1, with each of switches S21 through S28 being a controllable MOS transistor switch. In this embodiment, enabling from one to eight of the collection of switches S21 through S28 produces eight distinct values of effective series resistance for the overall assembly 110, producing eight distinct high frequency peaking characteristics for the combined ENRZ subchannel detector. In a practical embodiment, each instance of 110 in FIG. 1 is replaced by an instance of FIG. 3; the number of switches closed in a given instance of FIG. 3 may be zero (to disconnect that input in the second or third operational modes, as subsequently described) or a predetermined value to provide the desired frequency characteristics associated with a determined impedance value. Adjustment of the resistor value to attenuate high-frequency signal may be useful in baud-rate clock data recovery (CDR) applications, and bandwidth may be reduced if channel loss is low. Since the front-end may be shared between the Rx and the Tx, the passive MIC may completely isolate Rx from Tx by disconnecting all switches, which may increase frequency response. In some embodiments, a secondary protection device composed of a diode and a resistor (often referred to as a charged device model (CDM) diode and resistor) used to protect the system from CDM failures may be replaced by a single CDM diode, which may increase the frequency response.

In some embodiments, switching circuit S2 in resistor circuit 110 may be controlled using a single mode control bit a to set an operational mode, as shown in FIG. 1. Additionally, resistor circuit 110 may include a tunable impedance including a plurality of parallel switched-resistor circuits as show in FIG. 3, where switches S21-S28 are controlled by a multi-bit impedance control signal to set an impedance value of R2, and the mode switch controlled by mode control signal a sets the operation mode. In some embodiments, the control signals provided to S21-S28 may be logically ANDed with mode control signal a, so that the impedance value only connects wire W0 to the output node depending on the mode set by the mode control signal a.

Figure 11:
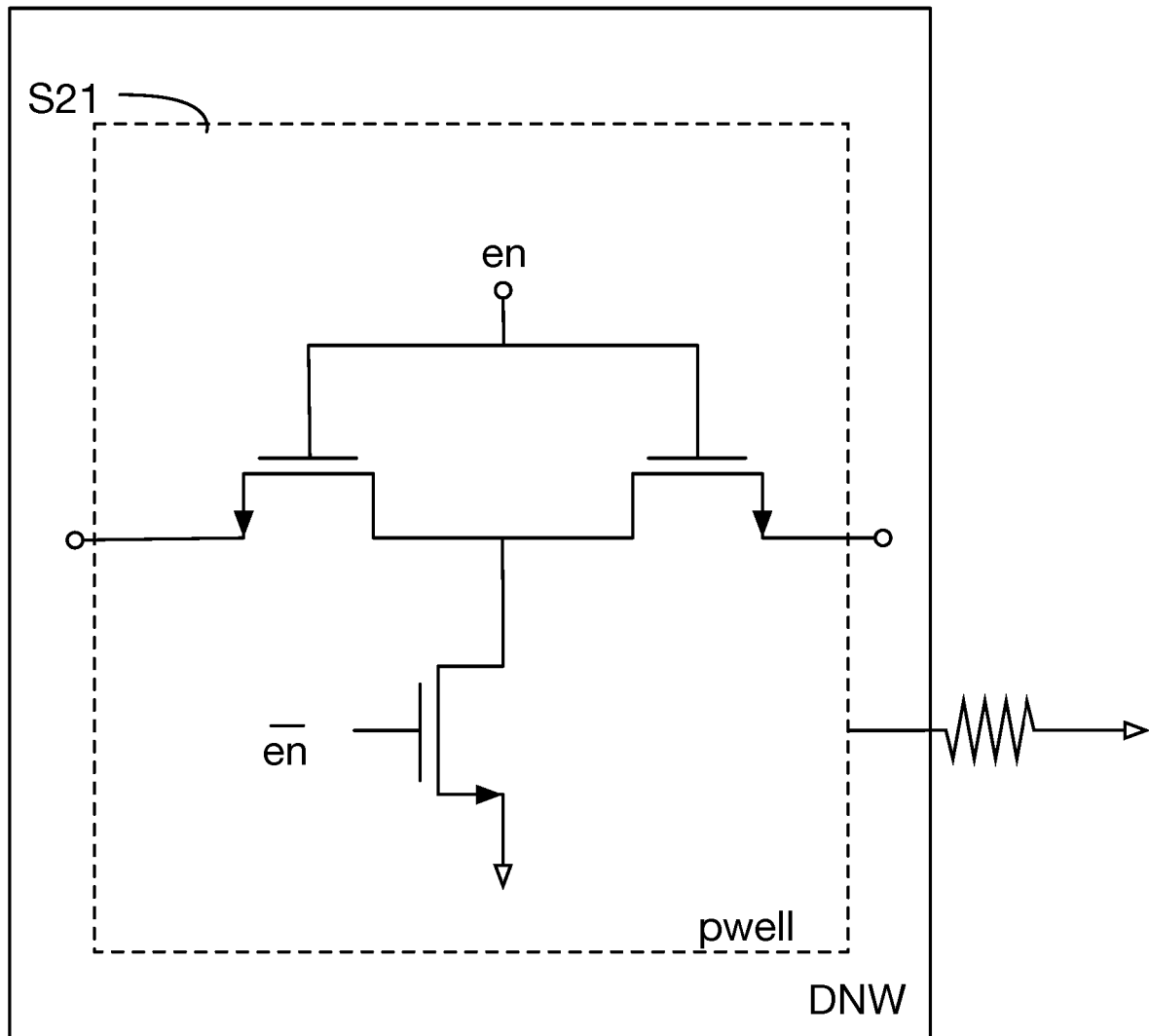
FIG. 11 is a circuit schematic of a switch used in the tunable resistor array, in accordance with some embodiments.

FIG. 11 is a circuit schematic of a switch, e.g., switch S21, in accordance with some embodiments. As shown in FIG. 11, the switch is composed of NMOS transistors embedded in a P well and further using a deep N well (DNW). In such embodiments, the parasitic capacitance of the switches in resistor network may be isolated from the matching network, which would result in less loss in the Tx.

In other embodiments, digitally controlled resistor and/or capacitor groups used to adjust the frequency characteristics of 120 and 121 may be used either alone or in combination with the previously described embodiment.

In embodiments where the circuit of FIG. 3 is incorporated to change the effective input series impedance, the number of switches closed in each instance of FIG. 3 may be the same across all instances and all subchannel receivers, except for instances where all switches are open, as in the case of fully disconnecting the pair of sub-channel output nodes associated with sub-channel $Sub_2$ in the "legacy" mode of operation as previously described.

Detection of other ODVS codes may be accomplished by adjustment of input resistor values to produce other input weighting ratios as described in [Holden]. In system environments where both true and compliment versions of input signals are available (as one example, from active CTLE stages having differential outputs,) both non-inverted and inverted signal values may be resistively summed prior to active detection.

Figure 8:
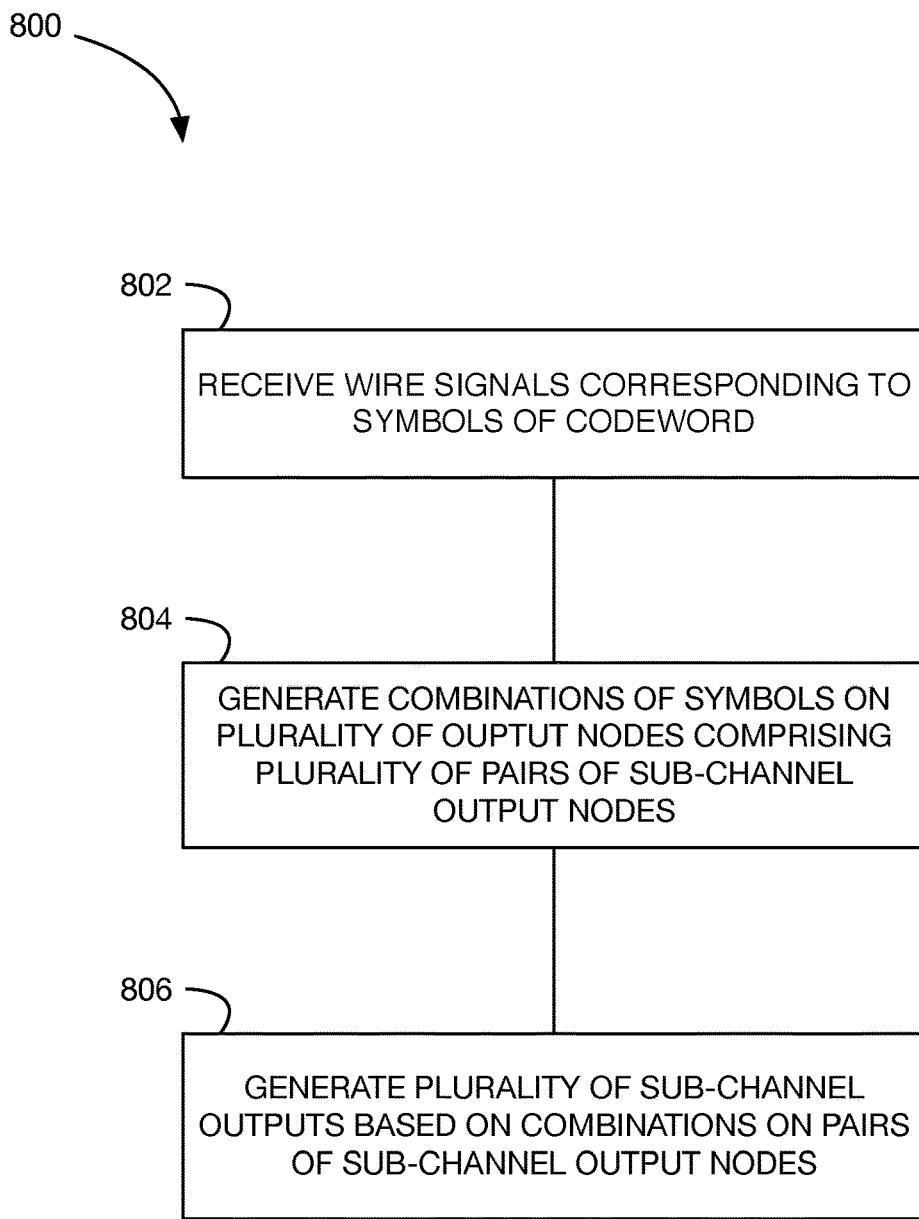
FIG. 8 is a flowchart of a method, in accordance with some embodiments.

FIG. 8 is a flowchart of a method 800, in accordance with some embodiments. As shown, method 800 includes receiving 802 a plurality of signals via a plurality of wires of a multi-wire bus, the plurality of signals corresponding to symbols of a codeword of a vector signaling code. A plurality of combinations of the symbols of the codeword of the vector signaling code are generated 804 using an interconnected resistor network connected to the plurality of wires of the multi-wire bus. The plurality of combinations of the symbols of the codeword of the vector signaling code are generated on a plurality of output nodes, where the plurality of output nodes are grouped to form a plurality of pairs of sub-channel output nodes associated with respective sub-channels of a plurality of sub-channels. A plurality of sub-channel outputs are generated 806 using a plurality of differential transistor pairs, each differential transistor pair of the plurality of differential transistor pairs connected to a respective pair of sub-channel output nodes of the plurality of pairs of sub-channel output nodes.

In some embodiments, the plurality of combinations of the symbols of the codeword are generated by adding two or more signals corresponding to the symbols of the codeword. In some embodiments, the plurality of combinations of the symbols of the codeword are generated by forming an average of two or more signals corresponding to the symbols of the codeword.

In some embodiments, each output node of the plurality of output nodes is connected to two or more wires of the plurality of wires of the multi-wire bus via respective resistors of a plurality of resistors, as shown in FIG. 2. In some embodiments, the plurality of resistors have equal impedance values. In some embodiments, each resistor of the plurality of resistors has a tunable impedance, as shown in FIG. 3. In the parallel-resistor network of FIG. 3, the method further includes selectively enabling one or more resistors in the parallel-resistor network to set an impedance value of the tunable impedance. Some such embodiments include receiving a multi-bit impedance control signal at the parallel-resistor network, where the multi-bit impedance control signal is indicative of the impedance value of the tunable impedance. In some embodiments, adjusting the tunable impedance adjusts high-frequency peaking of the plurality of sub-channel outputs, which may be useful in CDR and CTLE applications.

In some embodiments, the method further includes selecting an operational mode via a plurality of mode-selection transistors, the plurality of mode-selection transistors selectively coupling/decoupling one or more wires to/from one or more output nodes of the plurality of output nodes. Some such embodiments may include coupling one respective wire of the plurality of wires of the multi-wire bus to a respective output node of the plurality of output nodes. In such embodiments, each sub-channel output of the plurality of sub-channel outputs corresponds to a differential output across two wires of the plurality of wires of the multi-wire bus, as previously described in the "legacy" mode of operation.

In some embodiments, the plurality sub-channels correspond to a plurality of sub-channel vectors modulated by respective input data signals of a plurality of input data signals. In some such embodiments, the plurality of sub-channel vectors correspond to mutually orthogonal rows of an orthogonal matrix.

We claim:

1. An apparatus comprising:
    a plurality of wires of a multi-wire bus configured to carry signals corresponding to symbols of a codeword of a vector signaling code;
    an interconnected resistor network comprising a plurality of tunable resistors, the interconnected resistor network connected to the plurality of wires of the multi-wire bus, the interconnected resistor network configured to receive the signals corresponding to the symbols of the codeword of the vector signaling code and to responsively generate combinations of the symbols of the codeword of the vector signaling code at a plurality of output nodes, each output node of the plurality of output nodes connected to a respective two or more wires of the plurality of wires of the multi-wire bus via the plurality of tunable resistors, the plurality of output nodes grouped into a plurality of pairs of sub-channel output nodes associated with respective sub-channels of a plurality of sub-channels; and
    a plurality of differential transistor pairs, each differential transistor pair of the plurality of differential transistor pairs connected to a respective pair of sub-channel output nodes of the plurality of pairs of sub-channel output nodes and configured to generate a respective sub-channel output of a plurality of sub-channel outputs.

2. The apparatus of claim 1, wherein each combination of the symbols of the codeword corresponds to an addition of a respective two symbols of the codeword.

3. The apparatus of claim 1, wherein each combination of the symbols of the codeword corresponds to an average of a respective two symbols of the codeword.

4. The apparatus of claim 1, wherein the plurality of tunable resistors each have equal impedance values.

5. The apparatus of claim 1, wherein each tunable resistor of the plurality of tunable resistors comprises a parallel-resistor network configured to selectively enable one or more resistors in the parallel-resistor network to set a value of a tunable impedance of the tunable resistor.

6. The apparatus of claim 1, wherein the interconnected resistor network is configured to adjust a tunable impedance of each tunable resistor of the plurality of tunable resistors to adjust high-frequency peaking of sub-channel outputs of the interconnected resistor network.

7. The apparatus of claim 1, further comprising a plurality of mode-selection transistors configured to selectively decouple one or more wires from one or more output nodes of the plurality of output nodes.

8. The apparatus of claim 7, wherein the plurality of mode-selection transistors are configured to couple one respective wire of the plurality of wires of the multi-wire bus to a respective output node of the plurality of output nodes, and wherein each sub-channel output of the plurality of sub-channel outputs corresponds to a differential output across two wires of the plurality of wires of the multi-wire bus.

9. A method comprising:
receiving a plurality of signals via a plurality of wires of a multi-wire bus, the plurality of signals corresponding to symbols of a codeword of a vector signaling code;
generating, using an interconnected resistor network connected to the plurality of wires of the multi-wire bus, a plurality of combinations of the symbols of the codeword of the vector signaling code on a plurality of output nodes, each output node of the plurality of output nodes is connected to a respective two or more wires of the plurality of wires of the multi-wire bus, each wire of the respective two or more wires connected via a respective tunable resistor of a plurality of tunable resistors of the interconnected resistor network, the plurality of output nodes comprising a plurality of pairs of sub-channel output nodes associated with respective sub-channels of a plurality of sub-channels; and
generating a plurality of sub-channel outputs using a plurality of differential transistor pairs, each differential transistor pair of the plurality of differential transistor pairs connected to a respective pair of sub-channel output nodes of the plurality of pairs of sub-channel output nodes.

10. The method of claim 9, wherein generating the plurality of combinations of the symbols of the codeword comprises adding a respective two or more signals corresponding to a respective two or more symbols of the codeword.

11. The method of claim 9, wherein generating the plurality of combinations of the symbols of the codeword comprises forming an average of a respective two or more signals corresponding to a respective two or more symbols of the codeword.

12. The method of claim 9, wherein the plurality of tunable resistors each have equal impedance values.

13. The method of claim 9, wherein each tunable resistor of the plurality of tunable resistors comprises a parallel-resistor network, and wherein the method further comprises selectively enabling one or more resistors in the parallel-resistor network to set an impedance value of a tunable impedance of the tunable resistor.

14. The method of claim 9, further comprising adjusting high-frequency peaking of the plurality of sub-channel outputs by adjusting tunable impedance of the plurality of tunable resistors.

15. The method of claim 9, further comprising selecting an operational mode via a plurality of mode-selection transistors, the plurality of mode-selection transistors selectively decoupling one or more wires from one or more output nodes of the plurality of output nodes.

16. The method of claim 15, further comprising coupling one respective wire of the plurality of wires of the multi-wire bus to a respective output node of the plurality of output nodes, and wherein each sub-channel output of the plurality of sub-channel outputs corresponds to a differential output across two wires of the plurality of wires of the multi-wire bus.

* * * * *